(12) United States Patent
Cho et al.

(10) Patent No.: US 7,911,210 B2
(45) Date of Patent: Mar. 22, 2011

(54) DIAGNOSIS DEVICE, DIAGNOSIS METHOD, AND LAMP BALLAST CIRCUIT USING THE SAME

(75) Inventors: Gye Hyun Cho, Gyeonggi-do (KR); Jin Ho Choi, Lewisville, TX (US); Sang Cheol Her, Seoul (KR)

(73) Assignee: Fairchild Korea Semiconductor Ltd, Bucheon (KR)

( * ) Notice: Subject to any disclaimer, the term of this patent is extended or adjusted under 35 U.S.C. 154(b) by 284 days.

(21) Appl. No.: 12/392,929

(22) Filed: Feb. 25, 2009

(65) Prior Publication Data

US 2010/0213944 A1    Aug. 26, 2010

(51) Int. Cl.
    *G01R 31/00* (2006.01)
    *G01R 31/08* (2006.01)
    *H05B 37/02* (2006.01)
(52) U.S. Cl. .................. 324/414; 324/522; 315/291
(58) Field of Classification Search .......... 324/522, 324/512, 500, 414, 403
    See application file for complete search history.

(56) References Cited

U.S. PATENT DOCUMENTS

| | | | |
|---|---|---|---|
| 5,739,645 A | 4/1998 | Xia et al. | |
| 5,808,422 A | 9/1998 | Venkitasubrahmanian et al. | |
| 5,883,473 A | 3/1999 | Li et al. | |
| 6,243,017 B1* | 6/2001 | Kuisma | 340/641 |
| 6,538,448 B1* | 3/2003 | Tabell | 324/414 |
| 6,720,739 B2 | 4/2004 | Konopka | |
| 7,015,652 B2* | 3/2006 | Shi | 315/224 |
| 7,486,029 B2* | 2/2009 | Lee et al. | 315/224 |
| 2006/0006811 A1 | 1/2006 | Green et al. | |
| 2008/0030143 A1* | 2/2008 | Goriki et al. | 315/209 R |
| 2010/0213848 A1* | 8/2010 | Gao et al. | 315/86 |

OTHER PUBLICATIONS

FSFR-Series—Fairchild Power Switch (FPS) for Half-Bridge Resonant Converters, 2007, pp. 1-17, Fairchild Semiconductor Corporation.

* cited by examiner

*Primary Examiner* — Hoai-An D Nguyen
(74) *Attorney, Agent, or Firm* — Okamoto & Benedicto LLP

(57) ABSTRACT

The present invention relates a diagnosis device for detecting an end of lamp life of a lamp, a diagnosis method, and a lamp ballast circuit using the same. The diagnosis device generates a reference lamp voltage by adding a predetermined reference voltage to a distributed voltage corresponding to a lamp voltage applied to a lamp and generates an integrated lamp voltage by integrating the reference lamp voltage. The diagnosis device compares the integrated lamp voltage with a normal range that an integrated lamp voltage has when the lamp is in a normal state.

9 Claims, 5 Drawing Sheets

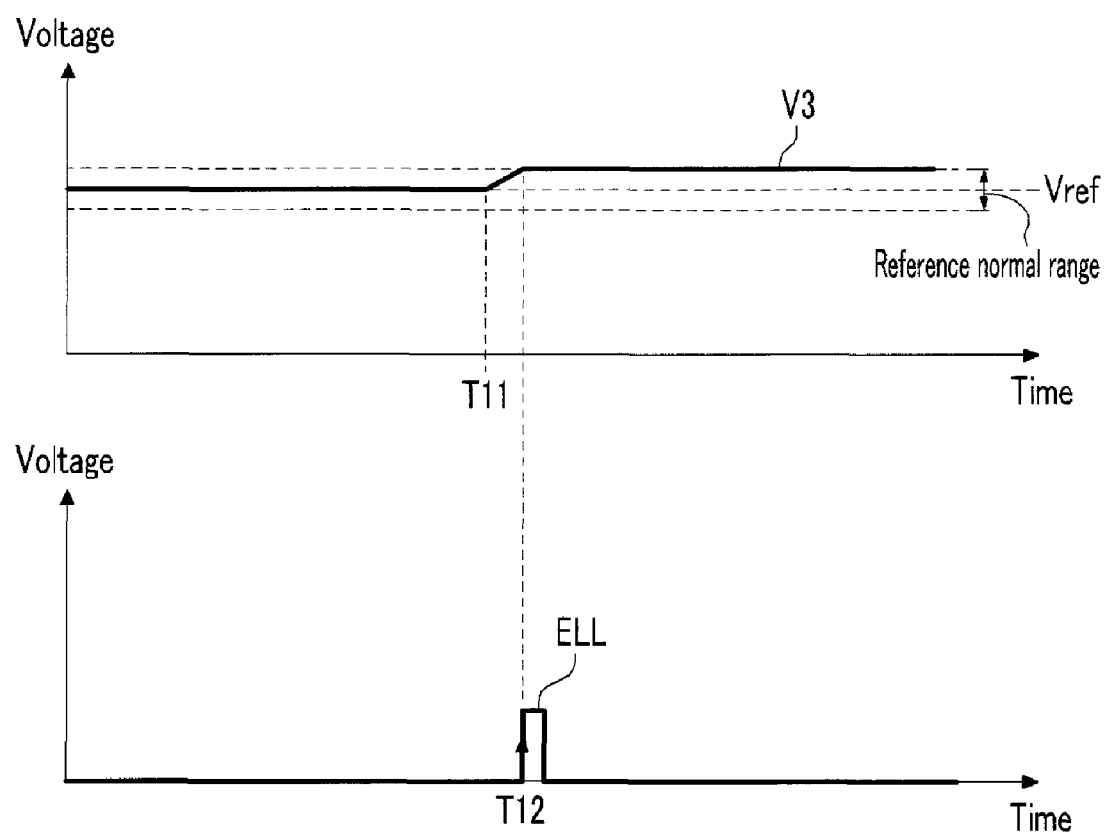

DIAGNOSIS DEVICE, DIAGNOSIS METHOD, AND LAMP BALLAST CIRCUIT USING THE SAME

BACKGROUND OF THE INVENTION (a) Field of the Invention

The present invention relates a diagnosis device, a diagnosis method, and a lamp ballast circuit using the same.

(b) Description of the Related Art

A lamp has a filament equivalent resistance that increases at the end of a lamp life compared with that at a normal state of the lamp.

If a regular amount of current is applied to the lamp after the filament equivalent resistance increases, the increment of filament equivalent resistance causes more current loss. The increment of filament equivalent resistance also increases heat that is generated from a filament. Therefore, a temperature of the filament increases. Also, the longer a time of using the lamp is, the more the temperature of the filament increases at the end of lamp life. The increased temperature of the filament melts down plastic parts that contact the filament. In this case, connection of the lamp and fixing parts that fix the lamp becomes weaken. As a result, the lamp may be separated from the fixing parts.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a diagnosis device, a diagnosis method, and a lamp ballast circuit having advantages of diagnosing the end of a lamp life.

An exemplary embodiment of the present invention provides a diagnosis device for detecting an end of lamp life of a lamp includes an adder, an integrator, and an end of life detector. The adder generates a reference lamp voltage by adding a predetermined reference voltage with a distributed voltage corresponding to a lamp voltage applied to the lamp. The integrator generates an integrated lamp voltage by integrating the reference lamp voltage. The end of life detector compares the integrated lamp voltage with a reference normal range that is generated by shifting a normal range according to the reference voltage and determines the end of lamp life of the lamp when the integrated lamp voltage reaches at a maximum value or a minimum value of the normal range. The normal range is a voltage range of the integrated lamp voltage at an non-end of lamp life of the lamp. The normal range may be determined according to a result of integrating an integrated lamp voltage of the lamp at an end of lamp life for a predetermined period.

Another embodiment of the present invention provides a diagnosis method for detecting an end of lamp life of a lamp, including generating a reference lamp voltage by adding a predetermined reference voltage to a distributed voltage corresponding to a lamp voltage applied to the lamp, generating an integrated lamp voltage by integrating the reference lamp voltage, and comparing the integrated lamp voltage with a reference normal range that is generated by shifting a normal range according to the reference voltage and determining the end of lamp life of the lamp when the integrated lamp voltage reaches at a maximum value or a minimum value of the normal range where the normal range is a voltage range of the integrated lamp voltage at an non-end of life of the lamp. The normal range may be determined according to a result of integrating the integrated lamp voltage of the lamp at an end of lamp life for a predetermined period.

Yet another embodiment of the present invention provides a lamp ballast circuit for operating a lamp including a lamp controller, a high side switch and a low side switch, a controller, and a diagnosis device. The lamp controller is connected to the lamp, thereby forming a resonant circuit. The high side switch and the low side switch control an operating voltage applied to the lamp controller. The controller controls switching operations of the high side switch and the low side switch. The diagnosis device generates a reference lamp voltage by adding a predetermined reference voltage to a distributed voltage corresponding to a lamp voltage applied to the lamp, generates an integrated lamp voltage by integrating the reference lamp voltage, compares the integrated lamp voltage with a reference normal range that is generated by shifting a normal range according to the reference voltage, and determines the end of lamp life of the lamp when the integrated lamp voltage reaches at a maximum value or a minimum value of the normal range where the normal range is a voltage range of the integrated lamp voltage at an non-end of lamp life of the lamp. The diagnosis device may include an adder for generating a reference lamp voltage by adding a predetermined reference voltage to a distributed voltage corresponding to a lamp voltage applied to the lamp, an integrator for generating an integrated lamp voltage by integrating the reference lamp voltage, and an end of life detector for comparing the integrated lamp voltage with a reference normal range that is generated by shifting a normal range according to the reference voltage and determining the end of lamp life of the lamp when the integrated lamp voltage reaches at a maximum value or a minimum value of the normal range where the normal range is a voltage range of the integrated lamp voltage at an non-end of life of the lamp. The diagnosis device may start operating after the lamp ballast circuit becomes a stabilization state. The diagnosis device may further include a switch connected between the integrator and the end of lamp life detector, wherein the controller turns on the switch after a predetermined time elapses in a lamp initial driving period.

The predetermined time may be a pre-heat period and a turn-on trial period for turning on the lamp.

BRIEF DESCRIPTION OF THE DRAWINGS

FIG. 3A is a graph showing a signal generated from a diagnosis device when a lamp has a lamp voltage having a waveform shown in FIG. 2B at the end of lamp life.

DETAILED DESCRIPTION OF THE EMBODIMENTS

Figure 1:
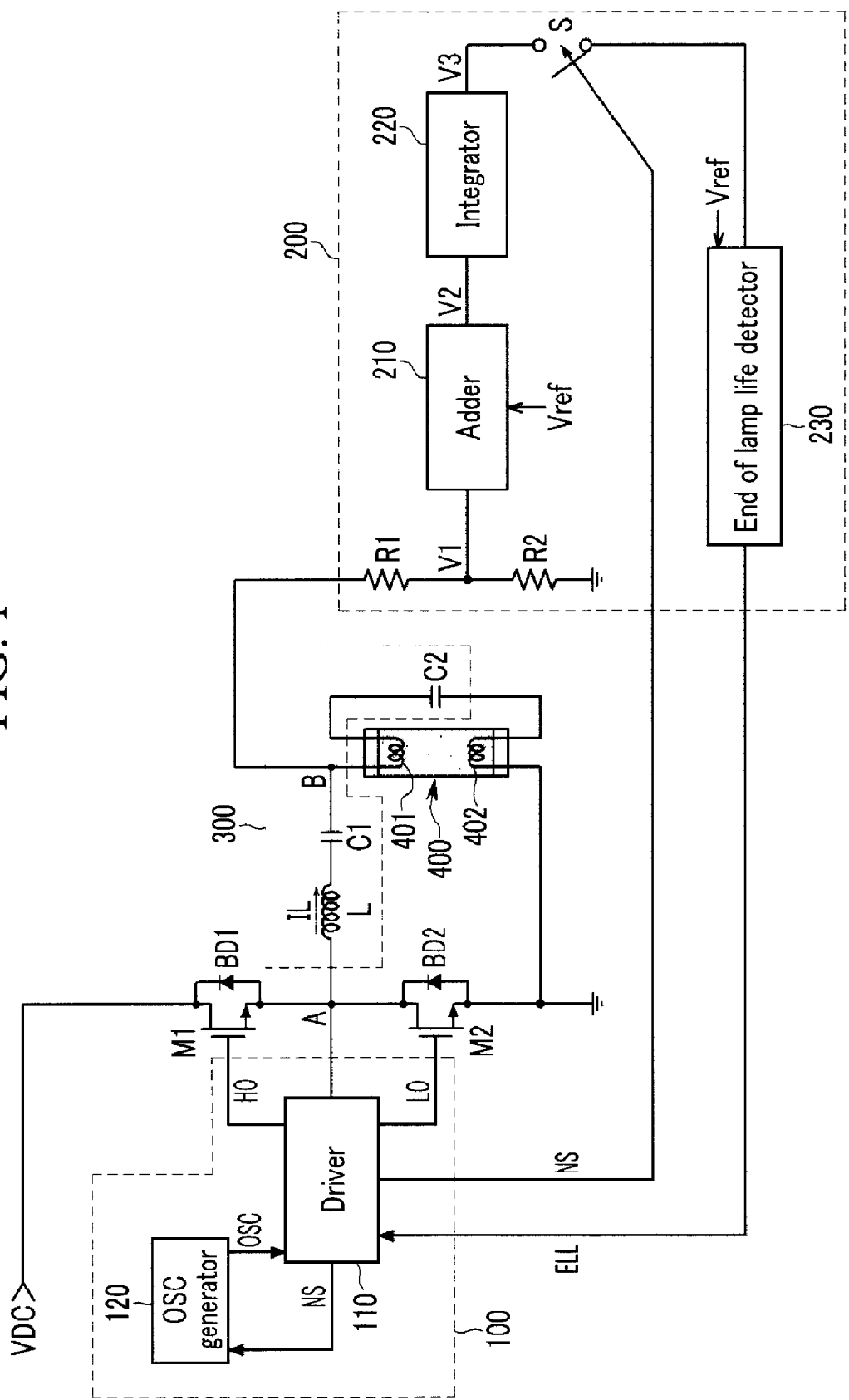
FIG. 1 is a diagram illustrating a diagnosis device having a lamp ballast circuit in accordance with the first exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention. Accordingly, the drawings and description are to be regarded as illustrative in nature and not restrictive. Like reference numerals designate like elements throughout the specification.

Throughout this specification and the claims that follow, when it is described that an element is "coupled" to another element, the element may be "directly coupled" to the other element or "electrically coupled" to the other element through a third element. In addition, unless explicitly described to the contrary, the word "comprise" and variations such as "comprises" or "comprising", will be understood to imply the inclusion of stated elements but not the exclusion of any other elements.

The present invention will be described more fully hereinafter with reference to the accompanying drawings, in which exemplary embodiments of the invention are shown.

Hereinafter, a diagnosis device and a lamp ballast device using the same an exemplary embodiment of the present invention will be described with reference to accompanying drawings.

FIG. 1 is a diagram illustrating a diagnosis device having a lamp ballast circuit in accordance with the first exemplary embodiment of the present invention.

As shown in FIG. 1, the lamp ballast circuit according to an exemplary embodiment of the present invention includes a controller 100, a diagnosis device 200, a power supply 300, a high side switch M1, and a low side switch M2. The high side switch M1 and the low side switch M2 are a metal-oxide semiconductor field effect transistor (MOSFET) and n channel type transistors. Although the switches M1 and M2 are n channel type transistors in the present embodiment, the present invention is not limited thereto.

The controller 100 controls switching operations of the high side switch M1 and the low side switch M2. In more detail, the controller 100 transfers a high side gate signal HO and a low side gate signal LO to a gate electrode of the high side switch M1 and a gate electrode of the low side switch M2, respectively so as to control the switching operation of the high side switch M1 and the low side switch M2. The controller 100 includes a driver 110 and an OSC generator 120 for generating an oscillator signal OSC. The driver 110 generates the high side gate signal HO and the low side gate signal LO according to the oscillator signal OSC. The oscillator signal OSC has a predetermined cycle for controlling the switching operation of the high side switch M1 and the low side switch M2. The high side switch M1 includes a drain electrode connected to a power source VDC and a source electrode connected to a drain electrode of the low side switch M2 at a node A. The low side switch M2 includes a source connected to the ground. The power source VDC supplies a DC voltage to the drain electrode of the high side switch M1. The driver 110 turns off an operating switch by transferring an operation control signal NS to a switch S in a lamp initial driving, a pre-heat period, and a turn-on trial period for turning on a lamp. In the lamp pre-heat period and the turn-on trial period, the OSC generator 120 generates an oscillator signal OSC having a frequency higher than that for a normal period of the lamp. The OSC generator 120 determines a frequency of the oscillator signal OSC according to an operation control signal NS. In the normal period, the switch S is turned on by the operation control signal NS.

The lamp controller 300 includes an inductor L, a capacitor C1, and a capacitor C2. The inductor L has an end that receives an operating voltage Vo of the node A. The lamp 400 according to an exemplary embodiment of the present invention includes two filaments 401 and 402. The capacitor C2 has both ends connected to each of the two filaments 401 and 402, respectively. That is, the capacitor C2 is connected to the lamp 400 in parallel. The capacitor C1 has one end connected to the other end of the filament 501 and the other end connected to the other end of the inductor L. The lamp 400, the inductor L, the capacitor C1, and the capacitor C2 form a resonant circuit. The operating voltage Vo is determined according to the switching operation of the high side switch M1 and the low side switch M2, and the operating voltage Vo is applied to the lamp controller 300. By the operating voltage Vo, current IL is generated at the inductor L and the current IL forms a sine wave.

Since switching frequencies of the high side switch M1 and the low side switch M2 are determined according to the frequency of the oscillator signal OSC, the switching frequencies of the high side switch M1 and the low side switch M2 at the lamp pre-heat period and the turn-on trial period are higher than those at the normal period of the lamp. A voltage of a contact B is set as a lamp voltage of the lamp 400 (hereinafter, a lamp voltage VLA). The lamp voltage VLA is the sum of voltages of both ends of the filament 401, a voltage of the capacitor C2, and voltages of both ends of the filament 402. The lamp voltage VLA is a sine wave having a predetermined cycle based on an offset voltage. Here, the cycle of the sine wave is determined according to the switching frequencies of the high side switch M1 and the low side switch M2.

While the lamp 400 is in a stabilization state period, the high side switch M1 and the low side switch M2 perform zero-voltage switching. After the operating voltage Vo becomes close to a voltage of a power source VDC because the current IL from the inductor L passes through a body diode BD1 of the high side switch M1, the high side switch M1 is turned on according to the oscillator signal OSC. After the operating voltage Vo becomes close to a ground voltage because the current IL passes through the body diode BD2, the low side switch M2 is turned on according to the oscillator signal OSC.

The diagnosis device 200 according to an exemplary embodiment of the present invention diagnoses an end of lamp life using a voltage of the lamp 400. The diagnosis device 200 according to an exemplary embodiment of the present invention detects a lamp voltage VR at a stabilization state period and diagnoses an end of lamp life of the lamp 400 according to a voltage range of the detected lamp voltage VR. In more detail, voltages at both ends of the lamp 400 are asymmetric to current that flows through the lamp 400 at the end of lamp life.

Figure 2A:
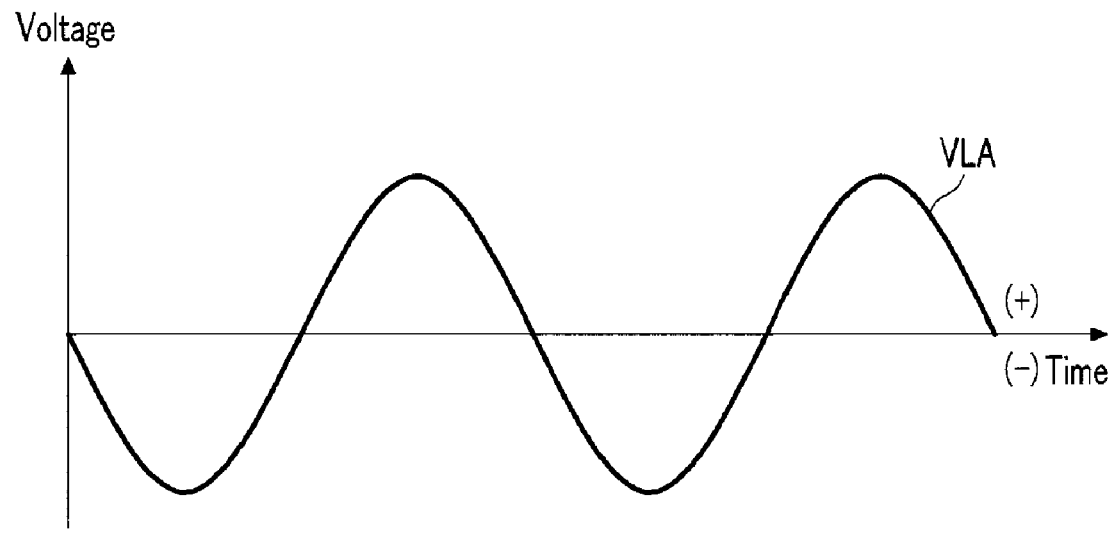
FIG. 2A is a graph showing a lamp voltage VLA at a non-end of lamp life.

FIG. 2A is a graph showing a lamp voltage VLA at a non-end of lamp life.

Figure 2B:
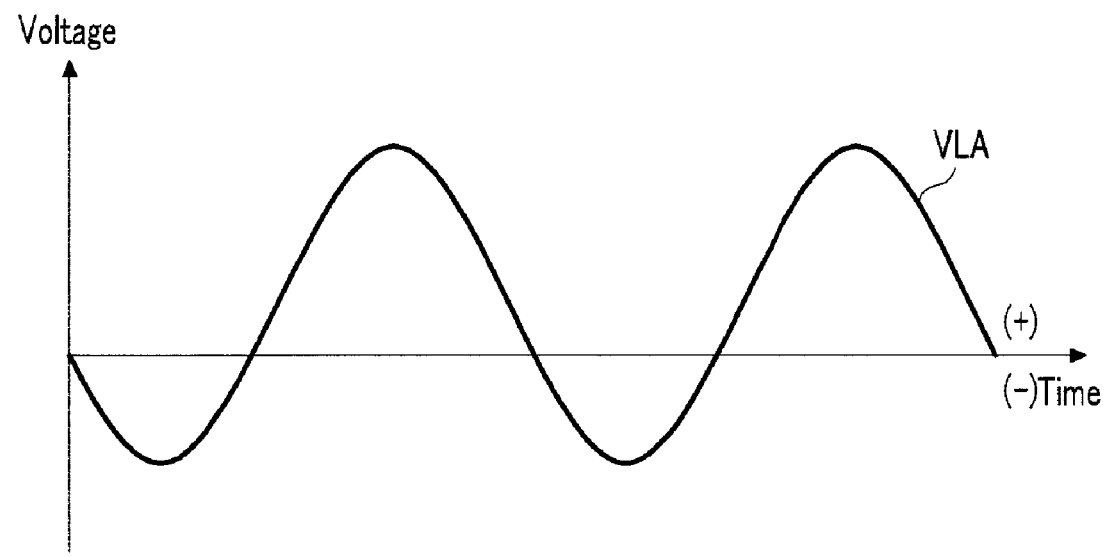
FIG. 2B and FIG. 2C are graphs showing a lamp voltage VLA at an end of a lamp life.
Figure 2C:
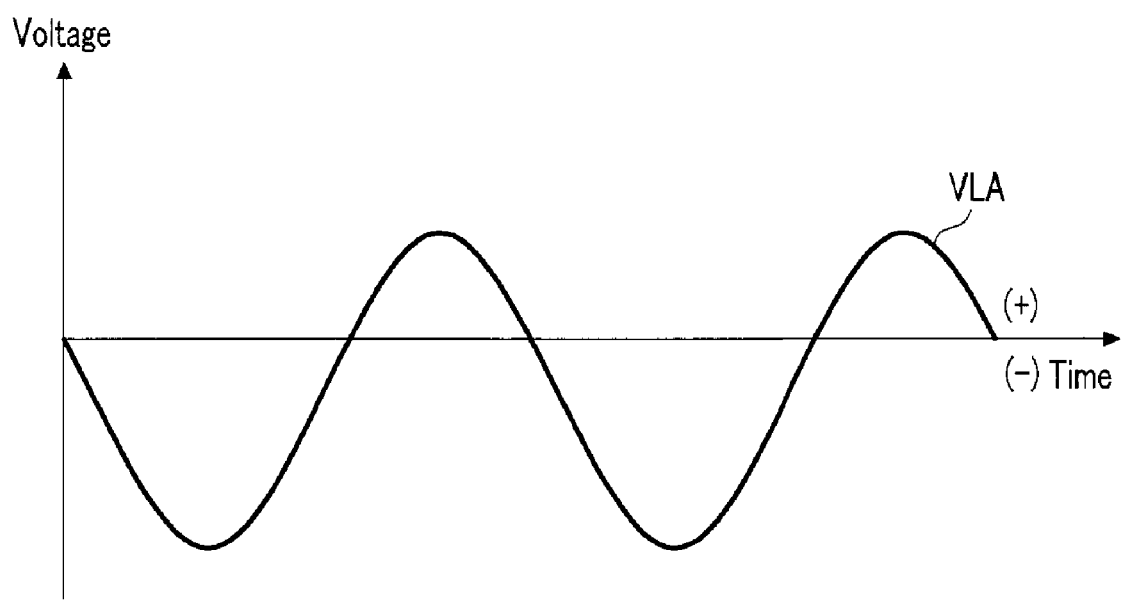

FIG. 2B and FIG. 2C are graphs showing a lamp voltage VLA at an end of a lamp life.

As shown in FIG. 2A, when the lamp 400 is in a normal period, not an end of lamp life, a positive (+) waveform and a negative (−) waveform of a lamp voltage VLA are symmetric to each other.

As shown in FIG. 2B and FIG. 2C, when the lamp 400 is at an end of lamp life, the positive (+) waveform and the negative (−) waveform of lamp voltage VLA are asymmetric to each other. In more detail, an absolute value of the largest value of the positive (+) waveform is greater than that of the lowest value of the negative (−) waveform in the lamp voltage VLA of FIG. 2B. An absolute value of the lowest value of the negative (−) waveform is greater than that of the largest value of the positive (+) waveform in the lamp voltage VLA of FIG. 2C.

The diagnosis device according to an exemplary embodiment of the present invention determines an end of lamp life using a result of integrating lamp voltage VLA using such characteristics. When the lamp voltage VLA is integrated by time in a normal period, the integrating result is close to zero. It is referred to as a normal range. The diagnosis device 200 determines that the lamp 400 is in a normal period if the result of integrating the lamp voltage VLA is in the normal range. If the lamp voltage VLA is integrated by time at the end of lamp life, an integrating result would exceed the normal range because deviation generated by the asymmetry of the lamp voltage VLA is also continuously integrated. As described above, the normal range may be set as the sum of integrated deviations as a result of integrating the lamp voltage VLA at the end of lamp life for a predetermined period. Therefore, the normal range is determined according to how long the predetermined period is set to, and the setting of the predetermined period may be properly selected according to design of a user.

As shown in FIG. 1, the diagnosis device 200 includes two resistors R1 and R2, an adder 210, an integrator 220, an operating switch (S), and an end of life detector having hysteresis for distributing the lamp voltage VLA by a resistance ratio (R2/(R1+R2)). Hereinafter, the lamp voltage distributed by two resistors R1 and R2 is referred to as a distributed lamp voltage V1.

The adder 210 generates a reference lamp voltage V2 by adding a reference voltage Vref to the distributed lamp voltage V1. The reference voltage Vref may be set according to predetermined design.

The integrator 220 generates an integrated lamp voltage V3 by integrating the reference lamp voltage V2 by time. When the operating switch S is turned on, the integrated lamp voltage V3 of the integrator 220 is input to the end of lamp life detector 230 having hysteresis.

The end of life detector 230 having hysteresis compares a reference normal range with the integrated lamp voltage V3 and generates an end of lamp life signal ELL according to the comparison result. The reference normal range means a normal range that is changed according to the reference voltage Vref. If the reference voltage Vref is a ground voltage, the reference normal range is equal to the normal range. If the reference voltage Vref is a predetermined positive voltage, the reference normal range is a range increased from the normal range as much as the reference voltage Vref. The end of life detector 230 generates an end of lamp life signal ELL, which is a high level pulse, if the integrated lamp voltage V3 reaches at a maximum value of the reference normal range. The end of life detector 230 generates an end of lamp life signal ELL, which is a high level pulse, if the integrated pump voltage reaches at a minimum value of a reference normal range. The end of life detector 230 transfers the end of lamp life signal ELL to the driver 110.

When the driver 110 receives the end of lamp life signal ELL, the driver 110 interrupts the switching operation of the high side switch M1 and the low side switch M2.

Figure 3B:
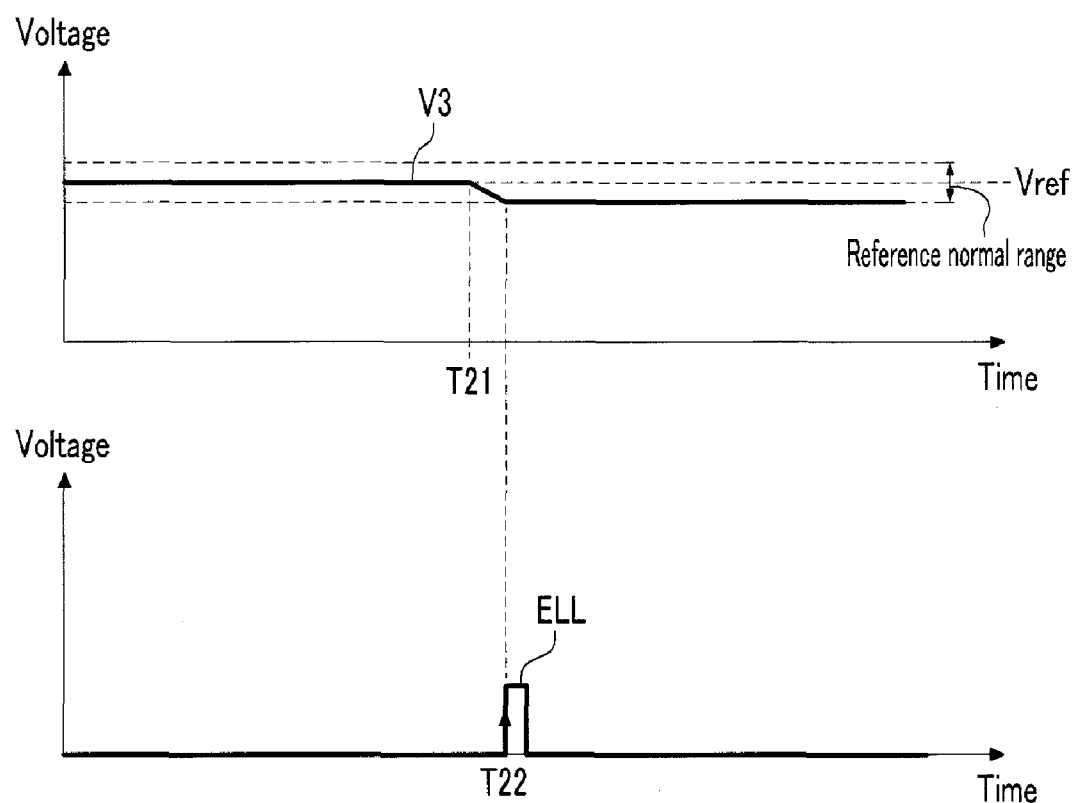
FIG. 3B is a graph showing a signal generated from a diagnosis device when a lamp has a lamp voltage VLA having a waveform shown in FIG. 2C at the end of lamp life.

FIG. 3A and FIG. 3B are graphs showing signals generated from a diagnosis device 200 at a normal period and an end of lamp life according to an exemplary embodiment of the present invention. FIG. 3A is a graph showing a signal generated from a diagnosis device when a lamp has a lamp voltage having a waveform shown in FIG. 2B at the end of lamp life. FIG. 3B is a graph showing a signal generated from a diagnosis device when a lamp has a lamp voltage VLA having a waveform shown in FIG. 2C at the end of lamp life.

As shown in FIG. 3A, the integrated lamp voltage V3 starts increasing at a time T11 and the end of life signal ELL is generated when the integrated lamp voltage V3 exceeds the reference normal range at a time T12.

Differently, the integrated lamp voltage V3 starts decreasing at a time T21 as shown in FIG. 3B, and the end of life signal ELL is generated when the integrated lamp voltage V3 exceeds the reference normal range at a time T22.

Since the switching operations of the high side switch M1 and the low side switch M2 are interrupted after the times T12 and T22, the integrated lamp voltage V3 sustains as the voltages of the times T12 and T22.

As described above, the diagnosis device according to an exemplary embodiment of the present invention can diagnosis the end of lamp life using the lamp voltage.

While this invention has been described in connection with what is presently considered to be practical exemplary embodiments, it is to be understood that the invention is not limited to the disclosed embodiments. Therefore, it will be apparent to those skilled in the art that various changes and modifications may be made. Therefore, the scope of the invention is only determined as defined in the following claims.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A diagnosis device for detecting an end of lamp life of a lamp, comprising:
    an adder for generating a reference lamp voltage by adding a predetermined reference voltage with a distributed voltage corresponding to a lamp voltage applied to the lamp;
    an integrator for generating an integrated lamp voltage by integrating the reference lamp voltage; and
    an end of life detector for comparing the integrated lamp voltage with a reference normal range that is generated by shifting a normal range according to the reference voltage and determining the end of lamp life of the lamp when the integrated lamp voltage reaches at a maximum value or a minimum value of the normal range where the normal range is a voltage range of the integrated lamp voltage at an non-end of lamp life of the lamp.

2. The diagnosis device of claim 1, wherein the normal range is determined according to a result of integrating an integrated lamp voltage of the lamp at an end of lamp life for a predetermined period.

3. A diagnosis method for detecting an end of lamp life of a lamp, comprising:
    generating a reference lamp voltage by adding a predetermined reference voltage to a distributed voltage corresponding to a lamp voltage applied to the lamp;
    generating an integrated lamp voltage by integrating the reference lamp voltage; and
    comparing the integrated lamp voltage with a reference normal range that is generated by shifting a normal range according to the reference voltage and determining the end of lamp life of the lamp when the integrated lamp voltage reaches at a maximum value or a minimum value of the normal range where the normal range is a voltage range of the integrated lamp voltage at an non-end of life of the lamp.

4. The diagnosis method of claim 3, wherein the normal range is determined according to a result of integrating the integrated lamp voltage of the lamp at an end of lamp life for a predetermined period.

5. A lamp ballast circuit for operating a lamp, comprising:
    a lamp controller connected to the lamp, thereby forming a resonant circuit;

a high side switch and a low side switch for controlling an operating voltage applied to the lamp controller;

a controller for controlling switching operations of the high side switch and the low side switch; and a diagnosis device for generating a reference lamp voltage by adding a predetermined reference voltage to a distributed voltage corresponding to a lamp voltage applied to the lamp, generating an integrated lamp voltage by integrating the reference lamp voltage, comparing the integrated lamp voltage with a reference normal range that is generated by shifting a normal range according to the reference voltage, and determining the end of lamp life of the lamp when the integrated lamp voltage reaches at a maximum value or a minimum value of the normal range where the normal range is a voltage range of the integrated lamp voltage at an non-end of lamp life of the lamp.

6. The lamp ballast circuit of claim 5, wherein the diagnosis device includes:

an adder for generating a reference lamp voltage by adding a predetermined reference voltage to a distributed voltage corresponding to a lamp voltage applied to the lamp;

an integrator for generating an integrated lamp voltage by integrating the reference lamp voltage; and an end of life detector for comparing the integrated lamp voltage with a reference normal range that is generated by shifting a normal range according to the reference voltage and determining the end of lamp life of the lamp when the integrated lamp voltage reaches at a maximum value or a minimum value of the normal range where the normal range is a voltage range of the integrated lamp voltage at an non-end of life of the lamp.

7. The lamp ballast circuit of claim 6, wherein the diagnosis device starts operating after the lamp ballast circuit becomes a stabilization state.

8. The lamp ballast circuit of claim 7, wherein the diagnosis device further includes a switch connected between the integrator and the end of lamp life detector, wherein the controller turns on the switch after a predetermined time elapses in a lamp initial driving period.

9. The lamp ballast circuit of claim 8, wherein the predetermined time is a pre-heat period and a turn-on trial period for turning on the lamp.

* * * * *